(12) United States Patent
Lin et al.

(10) Patent No.: US 7,394,678 B2
(45) Date of Patent: Jul. 1, 2008

(54) OVER-DRIVEN ACCESS METHOD AND DEVICE FOR FERROELECTRIC MEMORY

(75) Inventors: Chin-Hsi Lin, Hsinchu (TW); Chi-Ming Weng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/771,048

(22) Filed: Jun. 29, 2007

(65) Prior Publication Data

US 2007/0247891 A1 Oct. 25, 2007

Related U.S. Application Data

(62) Division of application No. 11/270,406, filed on Nov. 9, 2005, now Pat. No. 7,307,867, which is a division of application No. 10/633,982, filed on Aug. 4, 2003, now abandoned.

(30) Foreign Application Priority Data

Apr. 17, 2003 (TW) .............................. 92108988 A (51) Int. Cl.
*G11C 11/22* (2006.01)
*G11C 7/00* (2006.01)
(52) U.S. Cl. ............. 365/145; 365/189.15; 365/189.11; 365/205; 327/55; 327/57
(58) Field of Classification Search ................. 327/51, 327/52, 55, 57, 578; 365/145, 207, 205
See application file for complete search history.

(56) References Cited

U.S. PATENT DOCUMENTS 5,245,571 A 9/1993 Takahashi
6,028,783 A 2/2000 Allen et al.
6,049,501 A 4/2000 Pantelakis et al.
6,078,529 A 6/2000 Tada
6,118,687 A 9/2000 Kang
6,278,630 B1 8/2001 Yamada
6,310,797 B1 10/2001 Muneno
6,356,475 B1 3/2002 Tamura et al.
6,563,753 B1 5/2003 Rickes et al.
6,590,798 B1 7/2003 Komatsuzaki
6,646,906 B2 11/2003 Salling
6,801,447 B2 10/2004 Murakuki
6,903,987 B2 6/2005 Yoon et al.
2002/0176274 A1 11/2002 Ashikaga
2003/0053326 A1 3/2003 Murakuki
2003/0095457 A1 5/2003 Jeon et al.

(Continued)

FOREIGN PATENT DOCUMENTS

| JP | 06208796 | 7/1994 |
|---|---|---|
| JP | 11232881 | 8/1999 |
| JP | 2000187990 | 7/2000 |
| JP | 2002529876 | 9/2002 |
| WO | WO2004077441 | 9/2004 |

*Primary Examiner*—Ly D Pham
(74) *Attorney, Agent, or Firm*—Thomas, Kayden, Horstemeyer & Risley (57) ABSTRACT

An over-driven access method and device for ferroelectric memory. When accessing the data stored in a ferroelectric memory, the invention further provides an over-driven current to slightly reduce/raise the voltages in bit lines BL and BL' to further enlarge the voltage difference therebetween after having raised the plate-line/bit-line voltage using the plate-line/bit-line driven method.

2 Claims, 11 Drawing Sheets

U.S. PATENT DOCUMENTS

| | | |
|---|---|---|
| 2003/0128572 A1 | 7/2003 | Ogiwara et al. |
| 2004/0062107 A1* | 4/2004 | Komatsuzaki ............... 365/202 |
| 2004/0095799 A1 | 5/2004 | Jacob et al. |
| 2004/0095819 A1 | 5/2004 | Joachim et al. |
| 2004/0114416 A1* | 6/2004 | Noh ........................... 365/145 |
| 2004/0141353 A1 | 7/2004 | Madan |
| 2004/0233744 A1* | 11/2004 | Rodriguez et al. .......... 365/200 |
| 2005/0033901 A1 | 2/2005 | Igarashi |

* cited by examiner

OVER-DRIVEN ACCESS METHOD AND DEVICE FOR FERROELECTRIC MEMORY

CROSS-REFERENCE TO RELATED APPLICATION

This application is a Divisional of U.S. patent application Ser. No. 11/270,406, filed Nov. 09, 2005, now Pat. No. 7,307,867, which is a Divisional application of Ser. No. 10/633,982, filed Aug. 04, 2003, now Abandoned, which claimed the benefit of Taiwan application serial no. 92108988, filed April 17, 2003.

BACKGROUND OF THE INVENTION

1. Field of the Invention

The invention relates in general to a memory access method and device, and more particularly to an over-driven access method and device for ferroelectric memory.

2. Description of the Related Art

Figure 1:
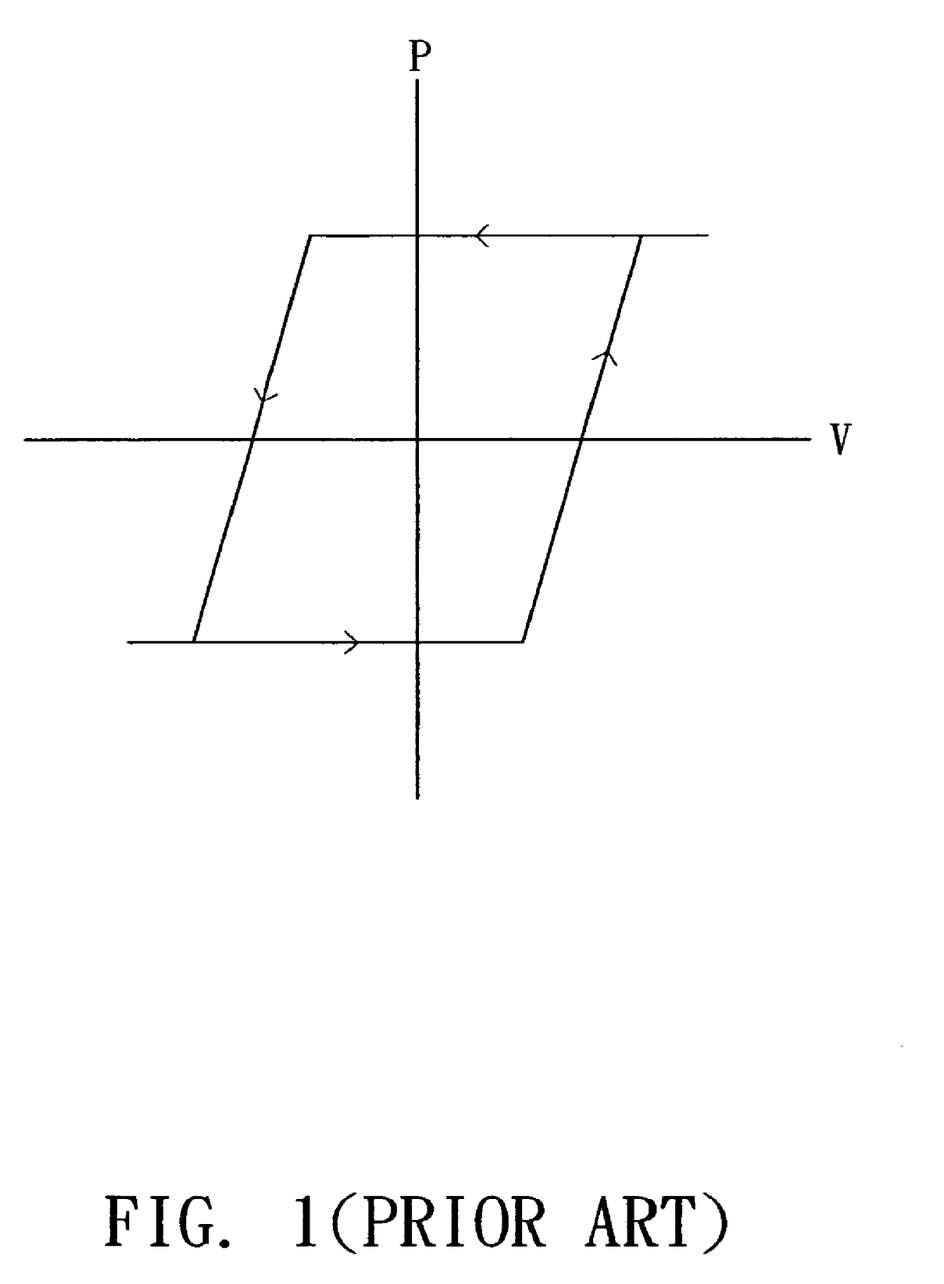
FIG. 1 is a transitional diagram illustrating the transition of polarized state for a ferroelectric capacitor.

Ferroelectric memory uses ferroelectric capacitor as the storage medium. Ferroelectric capacitor can be polarized to different polarized states, and thus can represent the stored data by means of polarized states. Please refer to FIG. 1, a transitional diagram illustrating the transition of the polarized state of ferroelectric capacitor. The transition of the polarized state of ferroelectric capacitor is hysteresis which means that a greater-than-zero voltage must be applied in order to convert the polarization of a ferroelectric capacitor from a negative state into a positive state and that a smaller-than-zero voltage must be applied in order to convert the polarization of a ferroelectric capacitor from a positive state into a negative state. Seeing that the polarized state of ferroelectric capacitor still can be sustained even in the absence of power supply, the ferroelectric capacitor does have the potential to replace the flash memory which is in current use now. Moreover, the polarized state of ferroelectric capacitor can be changed when the voltage applied onto the ferroelectric capacitor changes, thus has the potential to replace the dynamic random access memory (DRAM) as well.

Apart from having the characteristic of hysteresis, the ferroelectric capacitor has another characteristic, i.e., its capacitance is changeable. The formula for capacitance C is: $C=\Delta Q/\Delta V$, wherein Q is the quantity of electric charges; Q is the voltage drop of capacitor. The polarization of ferroelectric capacitor P is proportional to the quantity of electric charges Q, therefore capacitance C is proportional to the slope of the transition curve for polarization in FIG. 1. The larger the slope is, the greater the capacitance will be. It can be inferred from FIG. 1 that the capacitance during polarity transition is larger than that in a stabilized state.

Figure 2A:
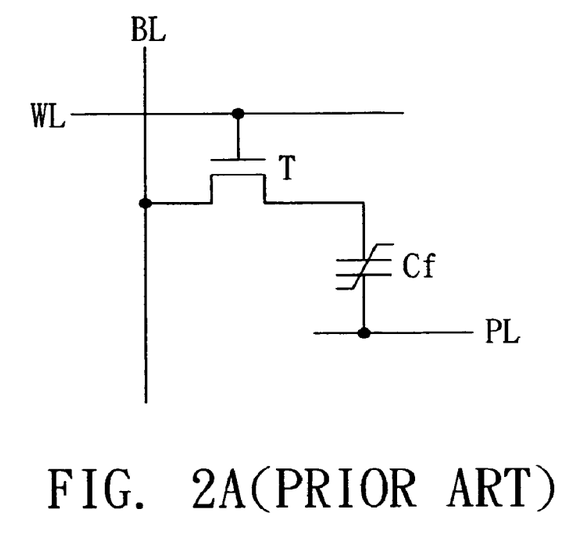
FIG. 2A is a schematic diagram illustrating a memory unit of a ferroelectric memory.
Figure 2B:
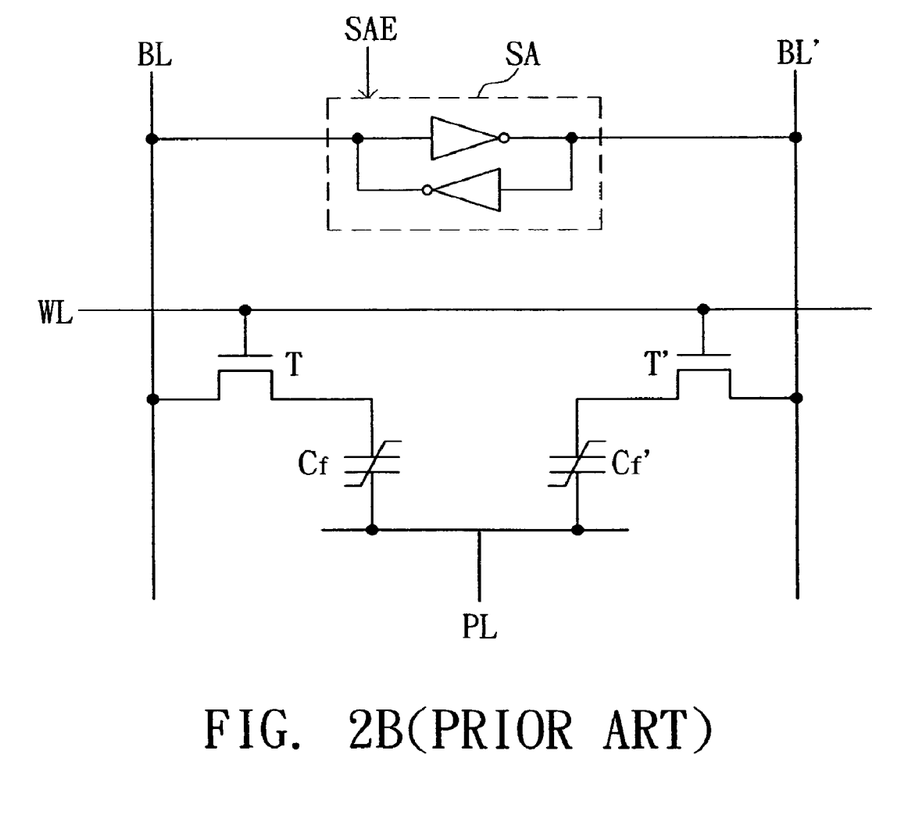
FIG. 2B is a schematic diagram illustrating another memory unit of a ferroelectric memory.

Please refer to FIG. 2A, a schematic diagram illustrating a memory unit of a ferroelectric memory. This memory unit which is in the form of 1T1C consists of one transistor, T, and one ferroelectric capacitor, Cf, with one end of ferroelectric capacitor Cf being coupled to plate line PL. When word line WL is enabled, the voltage drop in ferroelectric capacitor Cf is exactly the voltage difference between plate line PL and bit line BL. Please refer to FIG. 2B, a schematic diagram illustrating another memory unit of a ferroelectric memory. This memory unit which is in the form of 2T2C consists of two transistor, T and T', and two ferroelectric capacitors, Cf and Cf'. Every memory unit further comprises a sense amplifier SA which is used to amplify the voltage difference between bit line BL and bit line BL' to facilitate the access to the data stored at the ferroelectric memory. Sense amplifier SA as illustrated in FIG. 2B is a latch sense amplifier further comprising two phase inverters which raises the voltage in the high-voltage bit line to be even higher and reduces the voltage in the low-voltage bit line to be even lower. Sense amplifier SA is initiated when sense amplifier enabling signal SAE is received.

General speaking, there are two methods for the access of ferroelectric memory: the plate-line driven method and the bit-line driven method. Please refer to FIG. 3, a timing chart when plate-line driven method is used to access the ferroelectric memory using the ferroelectric memory in FIG. 2 as an example. At the initial stage, P and P', the polarized state of ferroelectric capacitor Cf and that of ferroelectric capacitor Cf', are of positive polarity and negative polarity respectively. Firstly, enable word line WL during period T1 such that transistors T and T' can be conducted. Next, enable plate line PL during period T2 and raise the voltage in plate line PL to high level. Since the voltage drop of ferroelectric capacitors Cf and Cf' has changed to be positive, their polarized states P and P' as shown in the diagram become positive as well. With the change in polarity from negative to positive, the capacitance of ferroelectric capacitor Cf' becomes larger and stores more electric charges causing bit line BL' to have a higher voltage accordingly. Following that, enable sensing g amplifier SA to enlarge the voltage difference between bit line BL and bit line BL' to facilitate the identification of the data stored at the memory unit. Meanwhile, the voltage in bit line BL' whose voltage is higher will be raised to high level; the voltage in bit line BL whose voltage is lower will be reduced to low level. The voltages in bit line BL' and the voltage in plate line PL are both at high levels, so the voltage drop in ferroelectric capacitor Cf' nears zero. The transition for the polarized state P which still remains positive is shown in the diagram. The abovementioned period T1 and T2 are driving stage during which time bit line voltages are differentiated; period T3 is sensing stage.

Figure 3:
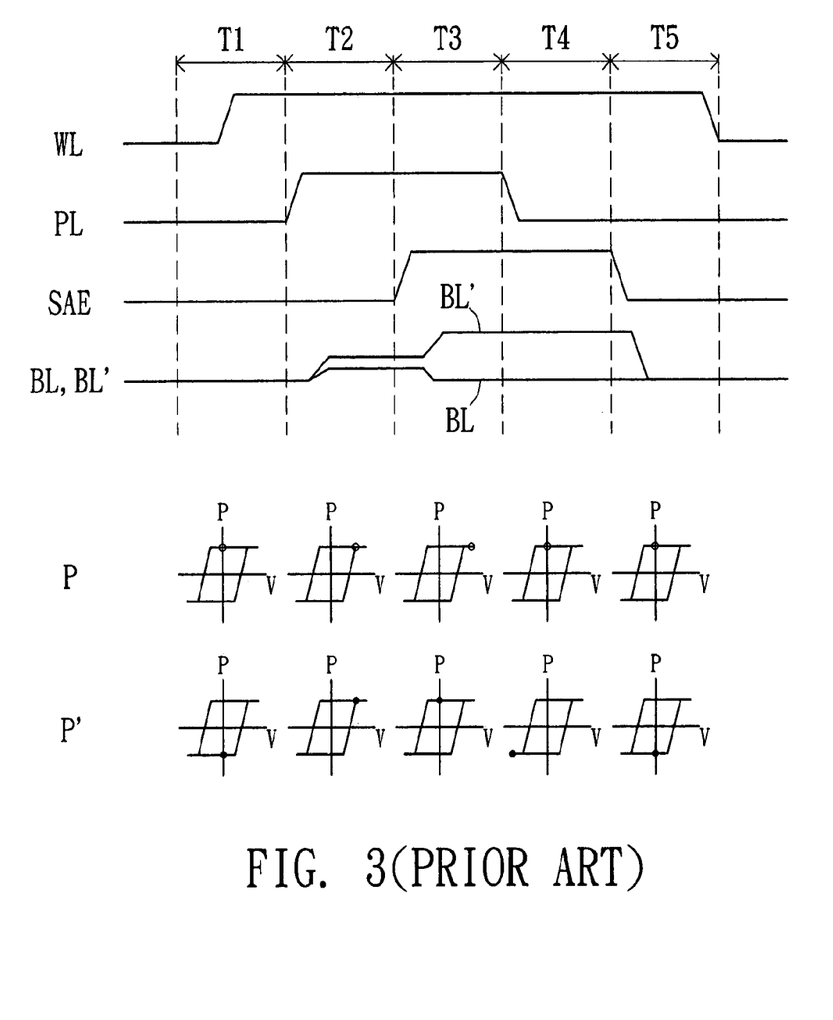
FIG. 3 is a timing chart when plate-line method is applied in a ferroelectric memory.

During period T3, P', the polarity of ferroelectric capacitor Cf' which was originally negative prior to accessing stage, becomes positive. In order to restore the original polarized state for ferroelectric capacitor Cf', some recovery procedures need to be taken. First, disable plate line PL during period T4, so that P', the polarized state of ferroelectric capacitor Cf', will become negative for the voltage drop in ferroelectric capacitor Cf' has already turned negative. Next, disable sense amplifier SA during period T5 such that the voltage in bit line BL will drop immediately causing the voltage drop in ferroelectric Cf to be reduced to zero. The original polarized state will thus be restored.

The plate-line driven method enables plate line PL and word line WL first causing bit lines BL and BL' to generate different voltages according to the polarized states of ferroelectric capacitors Cf and Cf'. The bit-line driven method enables bit lines BL and BL' before enabling word line WL, so that bit lines BL and BL' can generate different voltages according to the polarized states of ferroelectric capacitors Cf and Cf'. This has been understood by those who are conventional with this technology and will not be repeated here.

Figure 4:
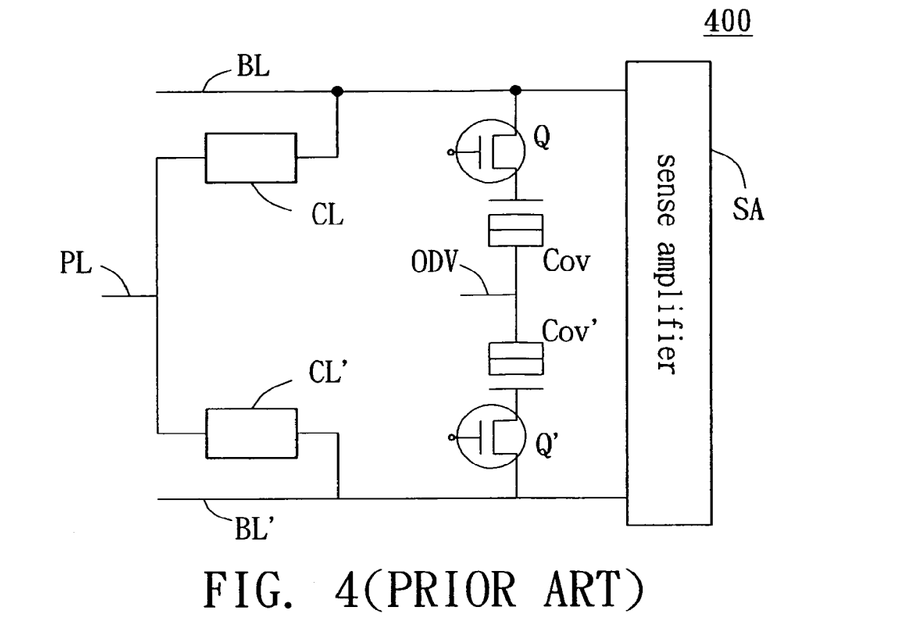
FIG. 4 is a conventional schematic diagram when over-driven access method is applied in a ferroelectric memory.
Figure 5:
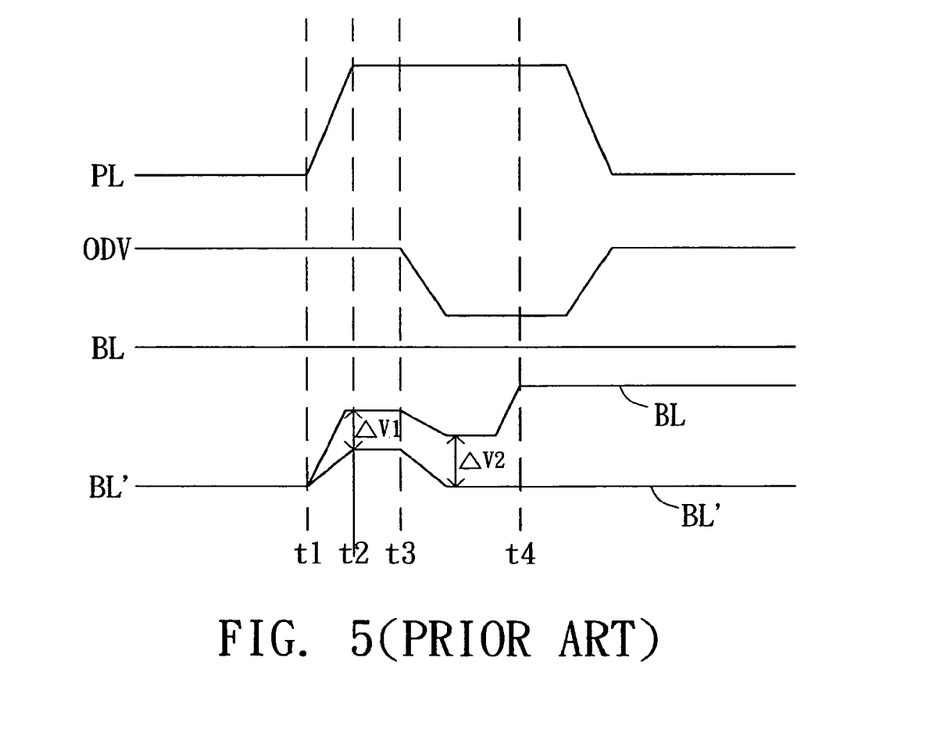
FIG. 5 is a conventional timing chart when over-driven method is applied in a ferroelectric memory.

In order to further improve access quality, an over-driven access method is proposed in "A 76 mm2 8 Mb Chain Ferroelectric Memory" (ISSCC, 2001). Please refer to FIG. 4, a schematic diagram for ferroelectric memory 400 according to a conventional over-driven access method. Ferroelectric memory 400 differs from the abovementioned ferroelectric memories in that bit lines BL and BL' are respectively connected to transistors Q and Q' and to capacitors Cov and Cov'. Please refer to FIG. 5, a timing chart according to a conventional over-driven method. Suppose the polarized states of cells CL and CL' are negative and positive respectively at the initial stage. The over-driven access method is used to assist the abovementioned plate-line driven method or bit-line driven method. In the present example, over-driven access method is used to assist plate-line driven method. First, raise the voltage in plate line PL at time t1. Since the polarity of cell CL has already changed from negative to positive, cell CL will have a larger capacitance and have more electric charges to be coupled to bit line BL. Consequently, the voltage in bit line BL will be higher than that in BL' with a voltage difference of $\Delta v1$. Next, reduce over-driven voltage ODV at time t3, so that the voltages in bit lines BL and BL' will drop accordingly. Owing to a larger capacitance in cell CL, the voltage in bit line BL will drop slower than that in bit line BL'. Due to the introduction of over-driven voltage OVD, $\Delta v2$, the voltage difference between bit line BL and bit line BL', is enlarged and is greater than $\Delta v1$. Last, initiate sense amplifier SA at time t5 to raise the voltage in bit line BL to high level and reduce the voltage in bit line BL' to low level. The contents stored at the present memory unit will be able to be accessed. However, more capacitors and transistors are required in this method resulting in an increase in chip size and manufacturing cost as well.

SUMMARY OF THE INVENTION

It is therefore an object of the invention to provide an over-driven access method and device which does not require any increase in chip size to improve access efficiency. When accessing the data stored in a ferroelectric memory, the invention further provides an over-driven current to further enlarge the voltage difference between bit line BL and bit line BL' after having raised the plate line voltage when plate-line driven method is applied or having raised the bit line voltage if the bit-line driven method is applied.

It is another object of the invention to provide a ferroelectric memory characterized by using a first current source and a second current source as over-driven current supplies.

It is another object of the invention to provide a plate-line over-driven access method. First, raise the plate line voltage to have a voltage difference generated between a positive bit line and a negative bit line. Next, enlarge this voltage difference by providing a first leakage current and a second leakage current to the positive bit line and the negative bit line respectively such that the voltages in the positive and the negative bit lines can be reduced. After that, enable a sense amplifier of the ferroelectric memory to further enlarge the voltage difference. Last, sense the voltage difference between the positive and the negative bit lines and output the contents stored at the ferroelectric memory accordingly.

It is another object of the invention to provide a bit-line over-driven access method. First, pre-charge the positive and the negative bit lines such that their voltages can be raised to high levels. Next, enable the word line such that a voltage difference between the positive bit line and the negative bit line occurs. After that, enlarge the voltage difference by providing a first leakage current and a second leakage current to the positive bit line and the negative bit line respectively. After that, enable a sense amplifier of the ferroelectric memory to further enlarge the voltage difference. Last, sense the voltage difference between the positive bit line and the negative bit line and output the content stored at the ferroelectric memory accordingly.

It is another object of the invention to provide a ferroelectric memory which uses the plate-line driven access method or the bit-line over-driven access method. The sense amplifier, which is controlled by switch P and switch N, is used as a current source when only one of the two switches is enabled and will provide normal functions of sensing and amplification when the two switches P and N are both enabled.

Other objects, features, and advantages of the invention will become apparent from the following detailed description of the preferred but non-limiting embodiments. The following description is made with reference to the accompanying drawings.

DETAILED DESCRIPTION OF THE INVENTION

The spirit of the invention is that when accessing the data stored in a ferroelectric memory, the invention further provides an over-driven current to further enlarge the voltage difference between bit line BL and bit line BL' after having raised the plate line voltage when plate-line driven method is applied or having raised the bit line voltage if the bit-line driven method is applied. The plate-line over-driven method which assists plate-line driven method and the bit-line over-driven method which assists bit-line driven method are disclosed below respectively.

Embodiment One

Figure 6A:
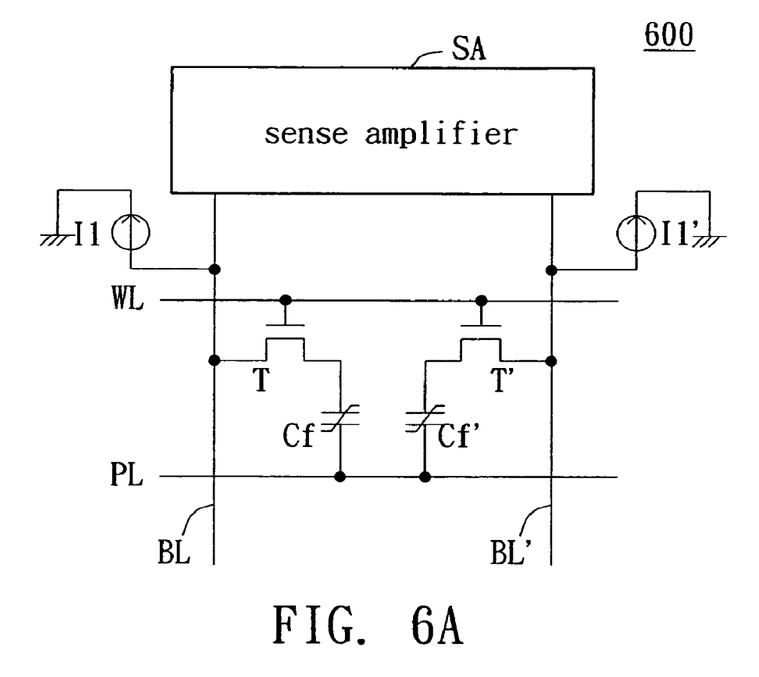
FIG. 6A is a schematic diagram for a ferroelectric memory using plate-line over-driven access method according to embodiment one of the invention.
Figure 6B:
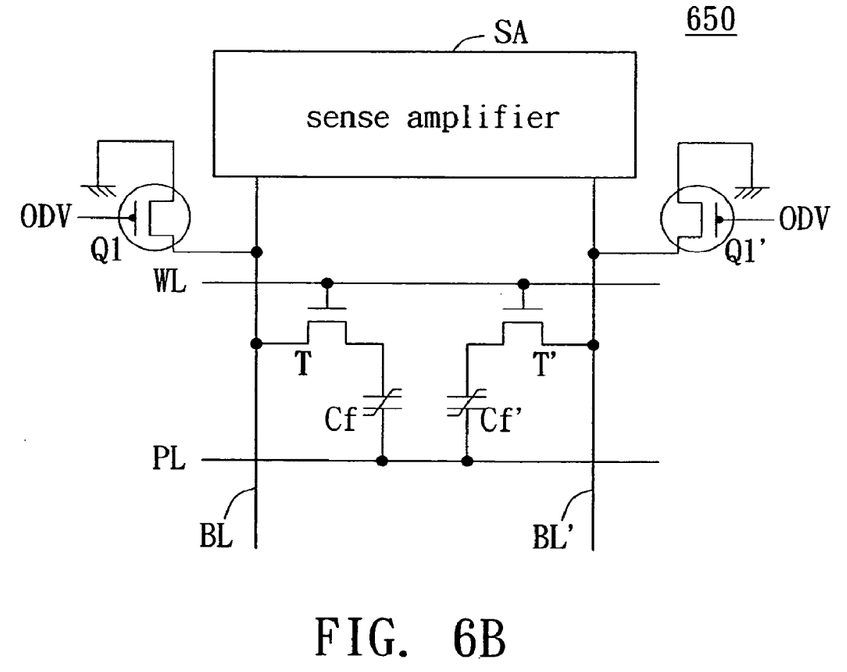
FIG. 6B is a schematic diagram for a ferroelectric memory illustrated in FIG. 6A.

FIG. 6A, a schematic diagram for ferroelectric memory 600 using plate-line over-driven access method according to embodiment one of the invention. What ferroelectric memory 600 differs from a conventional memory unit is that bit lines BL and BL' are provided with current sources I1 and I1' respectively which can be implemented by P-type transistors as shown in FIG. 6B, a schematic diagram for ferroelectric memory 650 in FIG. 6A. In FIG. 6B, current sources I1 and I1' are implemented by P-type transistors Q1 and Q1'; the conduction of transistors Q1 and Q1' is determined according to the level of over-driven voltage ODV.

Figure 7:
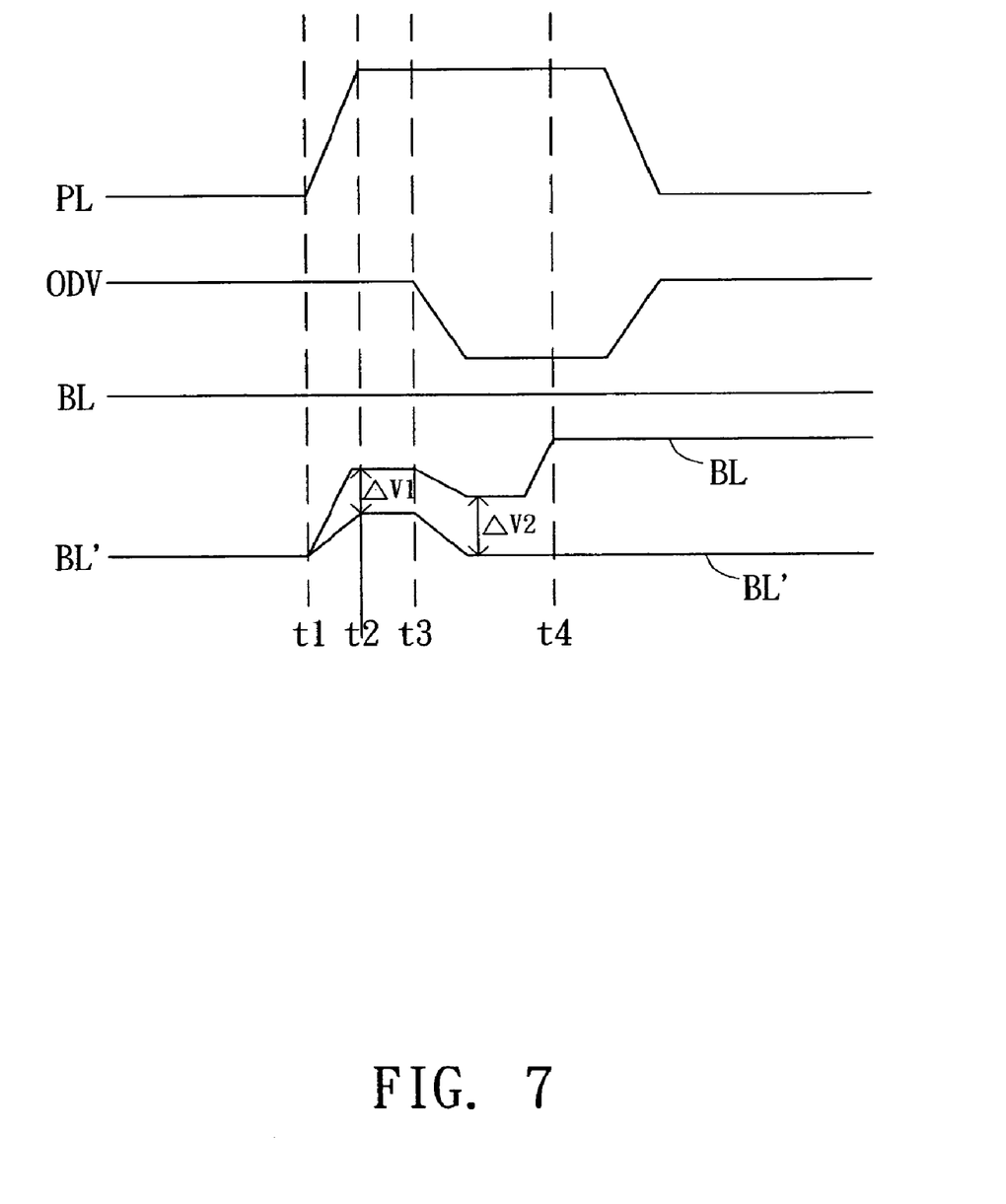
FIG. 7 is a timing chart when plate-line over-driven method is applied in a ferroelectric memory.

Please refer to FIG. 7, a timing chart when plate-line over-driven method is applied in ferroelectric memory 650. Suppose that ferroelectric capacitors Cf and Cf' are initially of negative polarity and of positive polarity respectively. First, raise the voltage in plate line PL at time t1. At which time, ferroelectric capacitor Cf will have a larger capacitance because its polarized state has been converted from negative polarity into positive polarity allowing more electric charges to be coupled to bit line BL. Consequently, bit line BL will have a higher voltage than bit line BL' with a voltage difference of $\Delta v1$. Next, reduce over-driven voltage ODV at time t3, so that the voltages in bit lines BL and BL' will drop accordingly. Since ferroelectric capacitor Cf has a larger capacitance than ferroelectric capacitor Cf', the voltage in bit line BL will drop slower than the voltage in bit line BL'. Owing to the introduction of over-driven voltage OVD, $\Delta v2$, the voltage difference between bit line BL and bit line BL', is enlarged and is greater than $\Delta v1$. Last, initiate sense amplifier SA at t5 to raise the voltage in bit line BL to high level and reduce the voltage in bit line BL' to low level. The contents stored at present memory unit will be able to be accessed.

Like the conventional ferroelectric memory shown in FIG. 2, the above disclosed ferroelectric memories which use over-driven access method as shown in FIG. 6A and FIG. 6B still require additional elements. However, the ferroelectric memories in FIG. 6A and FIG. 6B require smaller increase in chip size than the ferroelectric memory using over-driven access method in FIG. 4 does. Therefore, the ferroelectric memory according to the invention is able to reduce the required size for the chip. Another method which does not require any additional element is disclosed below.

Figure 8:
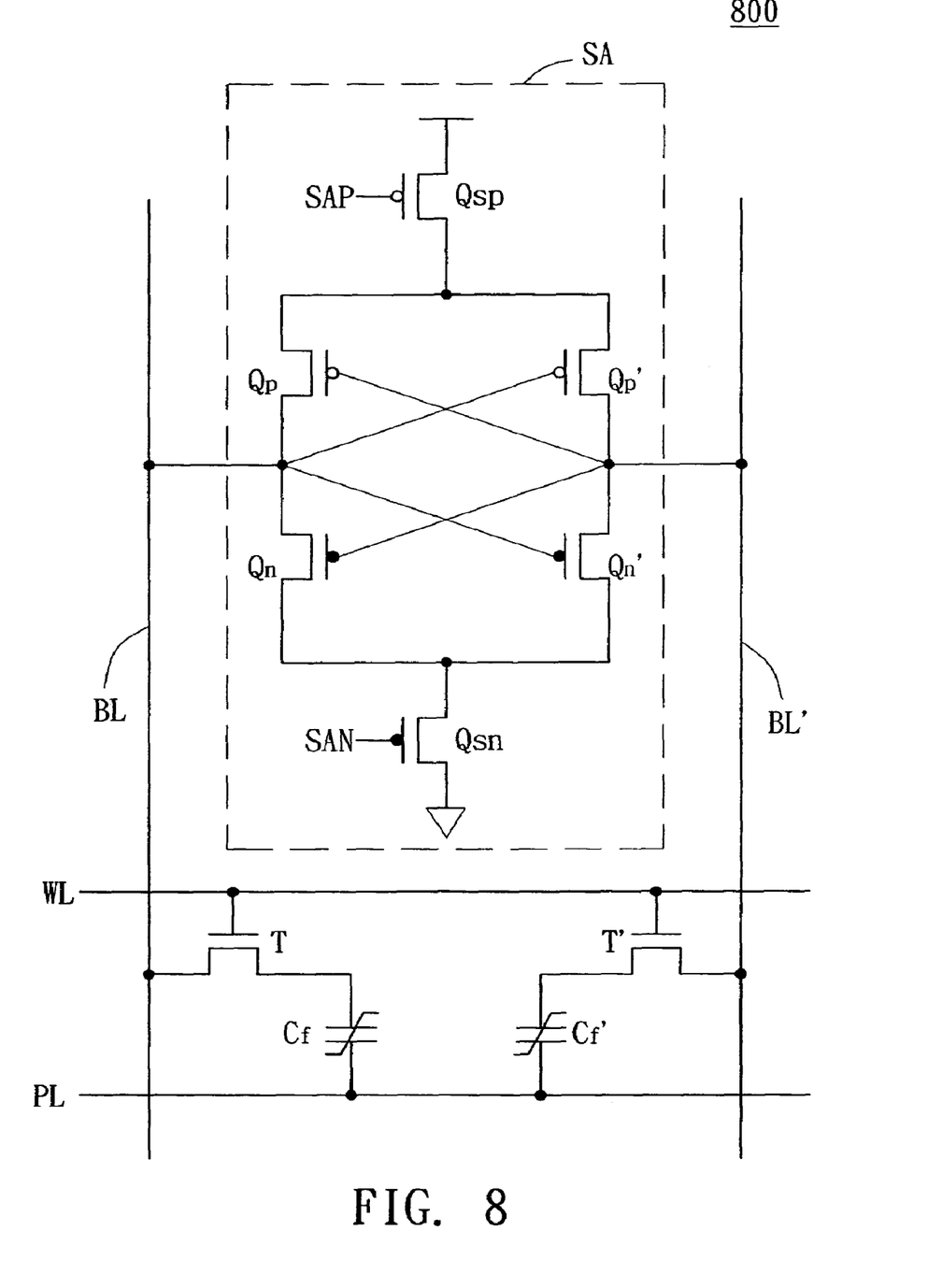
FIG. 8 is a schematic diagram for a ferroelectric memory using over-driven access method according to embodiment one of the invention.
Figure 9:
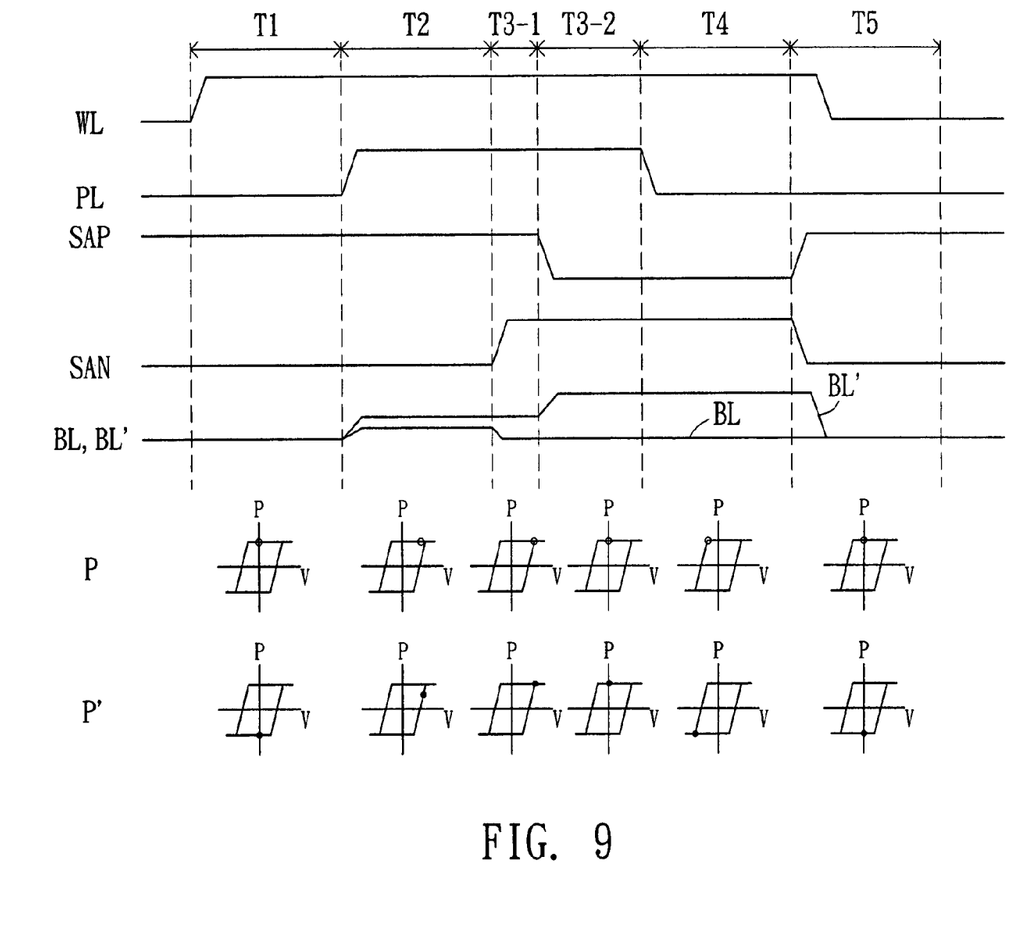
FIG. 9 is a timing chart when plate-line over-driven method is applied in a ferroelectric memory illustrated in FIG. 8.

Please refer to FIG. 8, a schematic diagram for a ferroelectric memory using over-driven access method according to embodiment one of the invention. Since ferroelectric memory 800 uses the existing sense amplifier SA as the source of currents, not any additional element is required. Sense amplifier SA is a latch sense amplifier comprising N-type transistors Qn, Qn' and Qsn, and P-type transistors Qp, Qp' and Qsp. Of which, transistor Qsn is controlled by controlling signal SAN while transistor Qsp is controlled by controlling signal SAP; transistors Qn and Qp form a set of phase inverter while transistors Qn' and Qp' form another set of phase inverter. Please refer to FIG. 9, a timing chart when plate-line over-driven method is applied in a ferroelectric memory illustrated in FIG. 8. Suppose that P and P', the polarized states of ferroelectric capacitors Cf and Cf', are initially of positive polarity and of negative polarity respectively. Enable word line WL to have transistors T and T' be conducted during period T1; and enable plate line PL to have the voltage in plate line PL be raised to high level during period T2. Since the voltage drop in ferroelectric capacitors Cf and Cf' has become positive, their polarized states P and P' as shown in the diagram are positive as well. Ferroelectric capacitor Cf' will have a larger capacitance and carry a larger number of electric charges causing the voltage in bit line BL' to raise when the polarized state of ferroelectric capacitor Cf' changes from negative into positive. Over-driven current is provided during period T3-1. During which time, enable controlling signal SAN to have transistor Qsn conducted. Since bit lines BL and BL' have greater-than-zero voltages, the electric charges in BL and BL' can flow out through transistors Qn, Qn' and Qsp causing the voltages in bit lines BL and BL' to drop down. The voltage in bit line BL almost does not drop at all because Cf, the electric capacitor which is connected to bit line BL, has a larger capacitance than Cf' has, but the voltage in bit line BL' drops more significantly. As a consequence, the voltage difference between bit line BL and bit line BL' is enlarged and hence the object of the invention is achieved. Next, enable controlling signal SAP during period T3-2. During which time, sense amplifier SA is enabled, so the voltage in bit line BL' is raised to high level while that of bit line BL is reduced to low level. Now the contents stored at memory unit can be identified according to the voltage difference between bit line BL and bit line BL'.

Embodiment Two

Figure 10A:
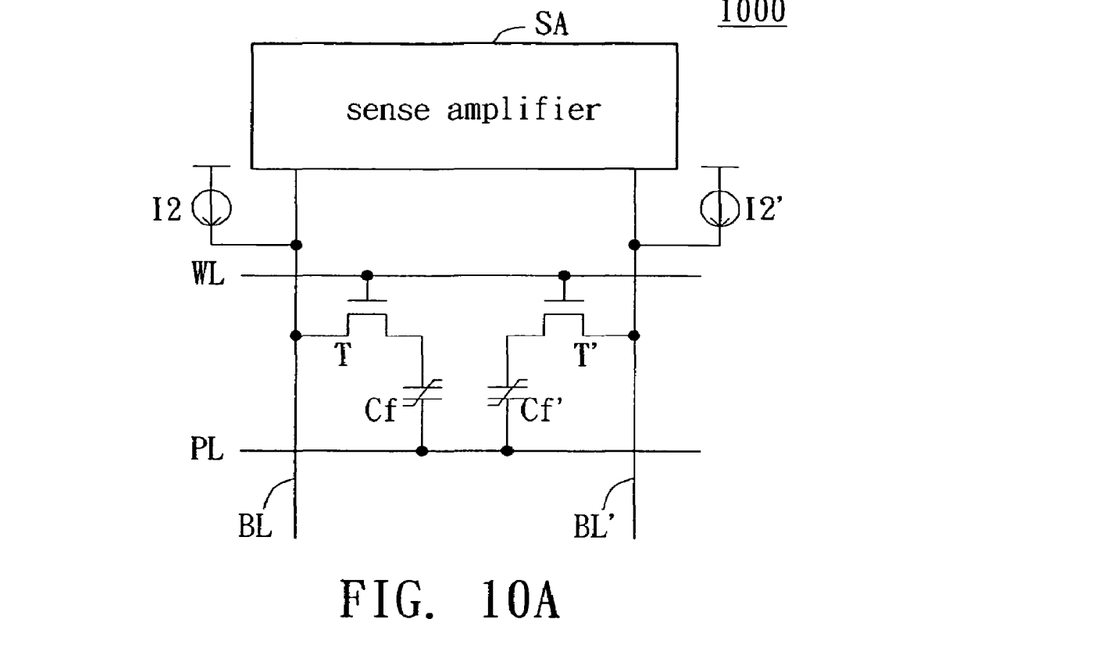
FIG. 10A is a schematic diagram for a ferroelectric memory using bit-line over-driven access method according to embodiment two of the invention.
Figure 10B:
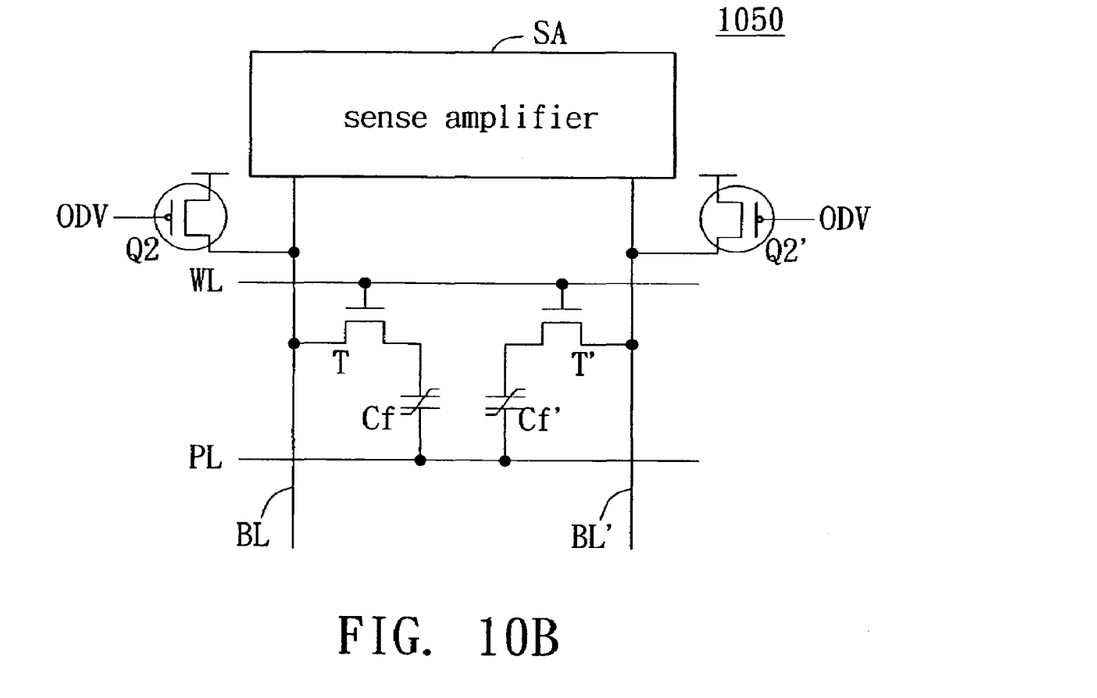
FIG. 10B is a schematic diagram for a ferroelectric memory illustrated in FIG. 1A.

Please refer to FIG. 10A, a schematic diagram for ferroelectric memory 1000, a ferroelectric memory using bit-line over-driven access method according to embodiment two of the invention. Ferroelectric memory 1000 differs from a conventional memory unit in that bit lines BL and BL' are provided with current source 12 and current source 12' respectively, wherein the source of currents can be implemented by P-type transistors as shown in FIG. 10B. FIG. 10B is a schematic diagram for ferroelectric memory 1050 illustrated in FIG. 10A. Of which, the function of current sources 12 and 12' is achieved via the use of P-type transistors Q2 and Q2'; the conduction of transistors Q2 and Q2' is determined according to the level of over-driven voltage ODV.

Figure 11:
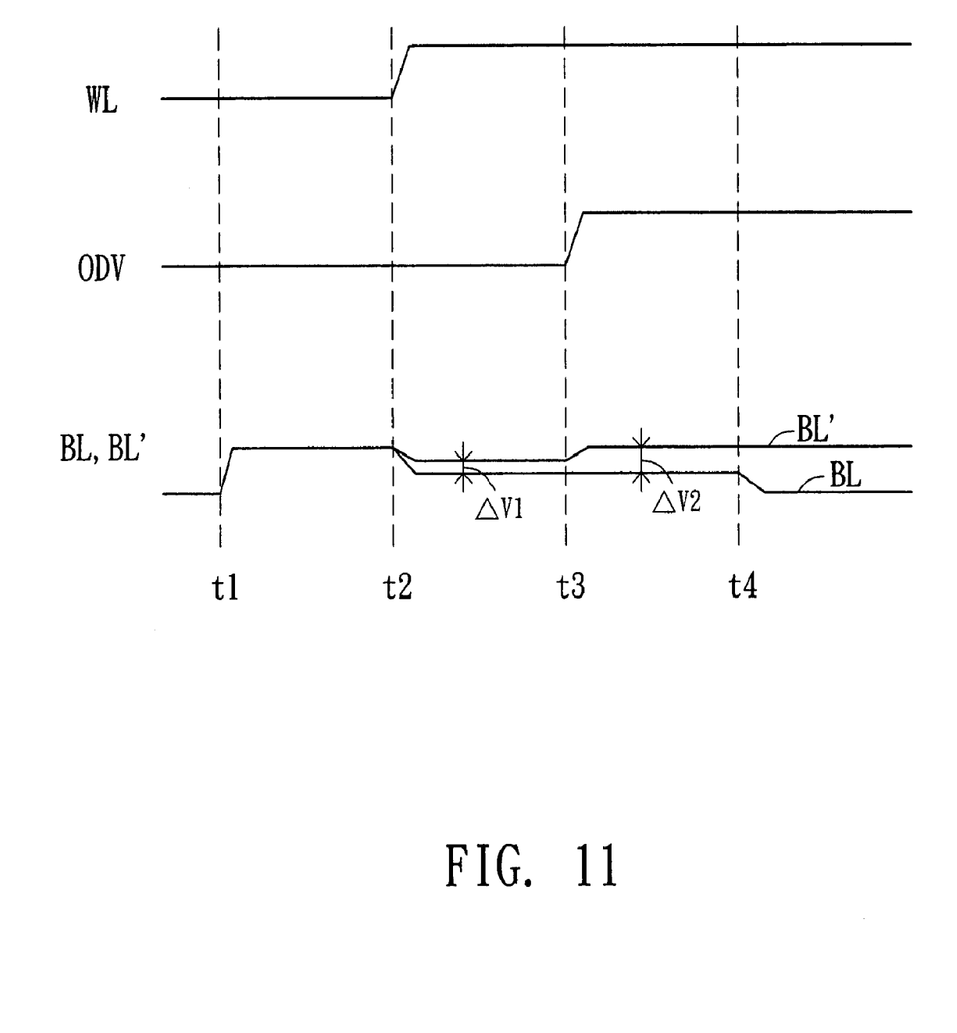
FIG. 11 is a timing chart when bit-line over-driven access method is applied in a ferroelectric memory illustrated in FIG. 10B.

Please refer to FIG. 11, a timing chart when bit-line over-driven access method is applied in ferroelectric memory 1050 illustrated in FIG. 10B. Suppose that ferroelectric capacitors Cf and Cf' are initially of negative polarity and of positive polarity respectively. First, charge bit lines BL and BL' until their voltages are raised to high levels at time t1. Next, enable word line WL at time t2. Since transistor T and T' are conducted now, the electric charges in bit lines will flow to ferroelectric capacitors Cf and Cf'. The voltage in bit line BL drops faster than the voltage in bit line BL' does because ferroelectric capacitor Cf has a capacitance larger than that of Cf' resulting in a voltage difference of $\Delta v1$ between bit line BL and bit line BL'. After that, raise over-driven voltage ODV to high level to have transistors Q2 and Q2' conducted at time t3. The voltages in bit lines BL and BL' will increase due to the inflow of electric charges originating from the source of currents. The voltage increase in bit line BL is insignificant because ferroelectric capacitor Cf has a capacitance larger than that of ferroelectric capacitor Cf', but the voltage increase in bit line BL' is more significant than that in bit line BL because the capacitance of ferroelectric capacitor Cf' is smaller than that of ferroelectric capacitor Cf resulting in a larger $\Delta v2$, the voltage difference between bit line BL and bit line BL'. Hence the object of the invention is achieved. At time t4, initiate sense amplifier SA to have the voltage in bit line BL be reduced to low level and to have the voltage in bit line BL' be raised to high level. Now the data stored at the memory unit can be accessed accordingly.

Like the conventional ferroelectric memory illustrated in FIG. 2B, the ferroelectric memory using bit line over-driven access method as illustrated in FIGS. 10A and 10B also requires additional elements. However, the required increase in chip size is smaller than the ferroelectric memory illustrated in FIG. 4 requires. Therefore the ferroelectric memory according to the invention is able to reduce the required chip size.

Figure 12:
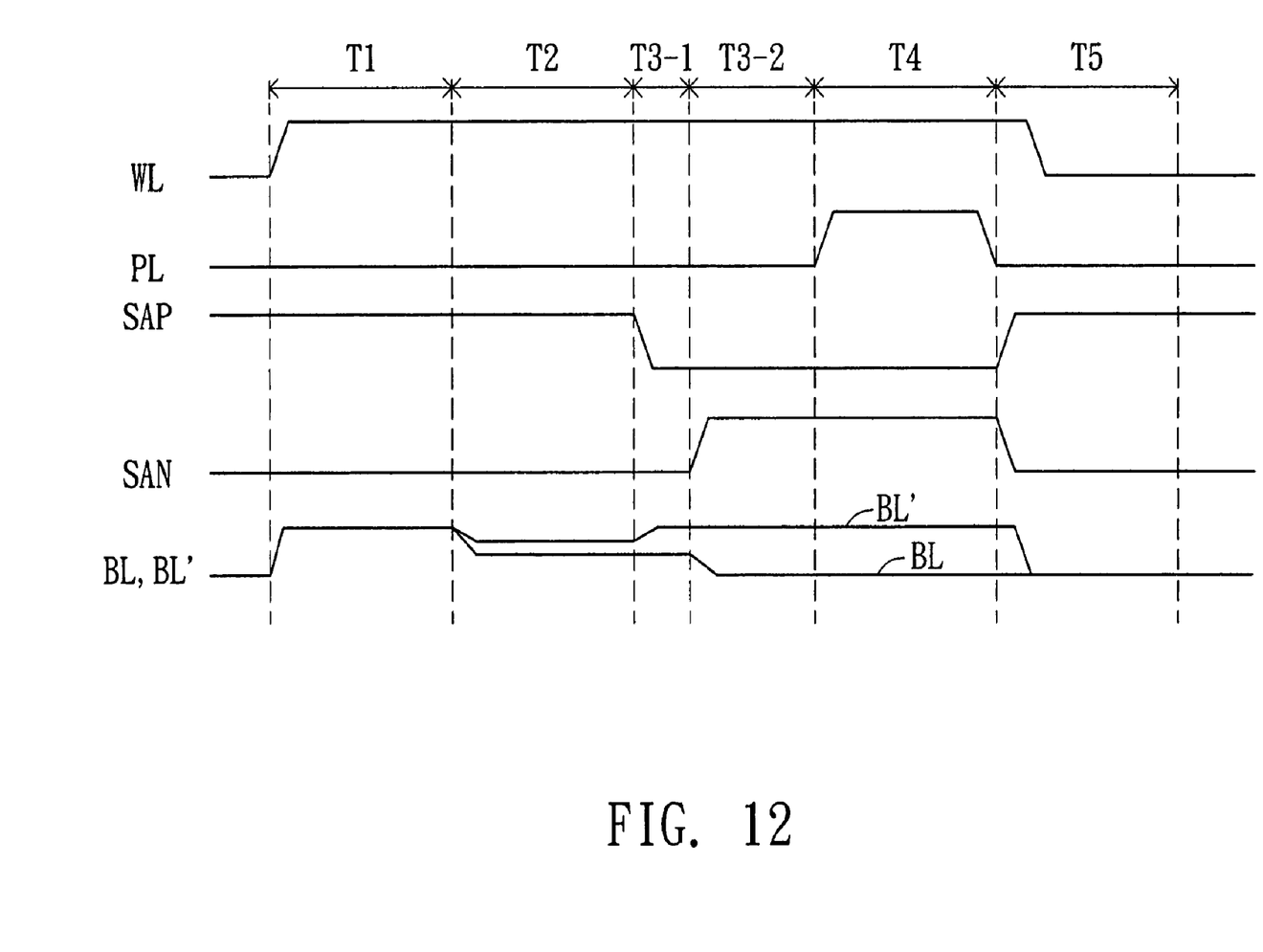
FIG. 12 is a timing chart when bit-line over-driven access method is applied in a ferroelectric memory illustrated in FIG. 8.

Moreover, ferroelectric memory 800 illustrated in FIG. 8 can also use bit line over-driven method to access the stored contents. Please refer to FIG. 12, a timing chart when bit-line over-driven access method is applied in ferroelectric memory 800 illustrated in FIG. 8. Suppose that ferroelectric capacitors Cf and Cf' are initially of positive polarity and of negative polarity respectively. First, charge bit lines BL and BL' during period T1. Next, during period T2 enable word line WL to have transistors T and T' be conducted so that the electric charges in the bit lines flow into ferroelectric capacitors Cf and Cf'. The voltage in bit line BL drops faster than that in bit line BL' because ferroelectric capacitor Cf has a larger capacitance than ferroelectric capacitor Cf' has resulting in a voltage difference of $\Delta v1$ between bit line BL and bit line BL'. After that, during period T3-1, reduce controlling signal SAP so that transistor Qsp can be conducted allowing electric charges to flow into bit lines BL and BL' from the source of currents. The voltage increase in bit line BL is insignificant because ferroelectric capacitor Cf has a large capacitance, but the voltage increase in bit line BL' is more significant because ferroelectric capacitor Cf' has a small capacitance resulting in a larger $\Delta v2$, the voltage difference between bit line BL and bit line BL'. Hence the object of the invention is achieved. After that, raise controlling signals SAN during period T3-2. Sense amplifier SA is now fully enabled allowing the voltage in bit line BL to be reduced to low level and the voltage in bit line BL' to be raised to high level. The contents stored at the memory unit can now be accessed. During periods T4 and T5 the polarized states of ferroelectric capacitors Cf and Cf' are restored and will not be repeated here.

The ferroelectric memory using over-driven access method and device as disclosed in above embodiments can increase accessing efficiency under the circumstance of a reduced chip size.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An access method applied in a ferroelectric memory comprising:
   providing the ferroelectric memory comprising a memory unit, a first current source, and a second current source, wherein the memory unit comprising:
   a positive bit line and a negative bit line which are parallel to each other, the first current source and the second current source coupled to the positive bit line and the negative bit line respectively;
   a word line which is virtually perpendicular to the positive and the negative bit lines;
   a positive memory cell coupled to the word line and the positive bit line, and configured to be connected to the positive bit line when the word line is enabled;
   a negative memory cell coupled to the word line and the negative bit line, and configured to be connected to the negative bit line when the word line is enabled;
   a plate line coupled to the positive and the negative memory cells; and
   a sense amplifier having a latch coupled to the positive bit line and the negative bit line, wherein the sense amplifier further including a first transistor for coupling the latch to ground and a second transistor for coupling the latch to a supply voltage;
   enabling the word line;
   enabling the plate line to generate a voltage difference between the positive bit line and the negative bit line after the word line is enabled;
   activating the first current source and the second current source to enlarge the voltage difference after the plate line is enabled;
   enabling the sense amplifier to further enlarge the voltage difference by raising the higher voltage among the voltage in the positive bit line and the voltage in the negative bit line to high level and reducing the lower voltage to low level after the first current source and the second current source are activated, wherein the sense amplifier is enabled by first activating the first transistor in the sense amplifier via a first enable controlling signal (SAN) and thereafter activating the second transistor in the sense amplifier via a second enable controlling signal (SAP); and
   sensing the voltage difference between the positive bit line and the negative bit line and outputting the content stored at the ferroelectric memory accordingly after the sense amplifier is enabled.

2. The method according to claim 1, wherein each of the first current source and the second current course comprises a transistor under the control of an over-driven voltage.

\* \* \* \* \*